(12) United States Patent
Schmitt et al.

(10) Patent No.: US 6,913,992 B2
(45) Date of Patent: Jul. 5, 2005

(54) METHOD OF MODIFYING INTERLAYER ADHESION

(75) Inventors: Francimar Campana Schmitt, Santa Clara, CA (US); Li-Qun Xia, Santa Clara, CA (US); Son Van Nguyen, Los Gatos, CA (US); Shankar Venkataraman, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/383,837

(22) Filed: Mar. 7, 2003

(65) Prior Publication Data

US 2004/0175929 A1 Sep. 9, 2004

(51) Int. Cl.$^7$ ........................................... H01L 21/4763
(52) U.S. Cl. ....................... 438/628; 438/622; 438/623; 438/638
(58) Field of Search ................................ 438/628, 622, 438/623, 637, 638

(56) References Cited

U.S. PATENT DOCUMENTS

| | | | |
|---|---|---|---|
| 5,087,959 A | 2/1992 | Omori et al. | |
| 5,554,570 A | 9/1996 | Maeda et al. | |
| 5,817,572 A | 10/1998 | Chiang et al. | |
| 5,818,071 A | 10/1998 | Loboda et al. | 257/77 |
| 5,926,740 A | 7/1999 | Forbes et al. | 438/763 |
| 5,989,998 A | 11/1999 | Sugahara et al. | |
| 6,124,641 A | 9/2000 | Matsuura | |
| 6,140,226 A | 10/2000 | Grill et al. | 438/637 |
| 6,147,009 A | 11/2000 | Grill et al. | 438/780 |
| 6,159,871 A | 12/2000 | Loboda et al. | 438/786 |
| 6,340,435 B1 | 1/2002 | Bjorkman et al. | 216/72 |
| 6,340,628 B1 | 1/2002 | Van Cleemput et al. | |
| 6,409,238 B1 | 6/2002 | Mikenis et al. | 292/347 |
| 6,436,824 B1 | 8/2002 | Chooi et al. | |

(Continued)

OTHER PUBLICATIONS

PCT Partial Search Report, dated Oct. 15, 2004 (AMAT/7838.PC), 6 pages.
U.S. Appl. No. 09/553,461, filed Apr. 19, 2000.
U.S. Appl. No. 09/679,843, filed Oct. 5, 2000.
PCT International Search Report for PCT/US2004/006849, dated Jan. 19, 2005 (AMAT/7838.PC).
PCT International Written Opinion for PCT/US2004/006849, dated Jan. 19, 2005 (AMAT/7838.PC).

Primary Examiner—Michael Trinh
(74) Attorney, Agent, or Firm—Moser, Patterson & Sheridan

(57) ABSTRACT

Methods are provided for processing a substrate for depositing an adhesion layer having a low dielectric constant between two low k dielectric layers. In one aspect, the invention provides a method for processing a substrate including depositing a barrier layer on the substrate, wherein the barrier layer comprises silicon and carbon and has a dielectric constant less than 4, depositing a dielectric initiation layer adjacent the barrier layer, and depositing a first dielectric layer adjacent the dielectric initiation layer, wherein the dielectric layer comprises silicon, oxygen, and carbon and has a dielectric constant of about 3 or less.

2 Claims, 3 Drawing Sheets

U.S. PATENT DOCUMENTS

| | | | |
|---|---|---|---|
| 6,486,061 B1 | 11/2002 | Xia et al. | 438/680 |
| 6,489,238 B1 | 12/2002 | Tsui | |
| 6,511,909 B1 | 1/2003 | Yau et al. | |
| 6,521,300 B1 | 2/2003 | Hsieh et al. | |
| 6,528,423 B1 | 3/2003 | Catabay et al. | 438/687 |
| 6,537,733 B2 | 3/2003 | Campana et al. | |
| 6,541,369 B2 | 4/2003 | Huang et al. | 438/624 |
| 6,570,256 B2 | 5/2003 | Conti et al. | 257/761 |
| 6,645,883 B2 | 11/2003 | Yamamoto et al. | |
| 6,656,837 B2 * | 12/2003 | Xu et al. | 438/676 |
| 6,673,725 B2 | 1/2004 | Shioya et al. | |
| 2002/0054962 | 5/2002 | Huang | |
| 2002/0054982 | 5/2002 | Dietrich et al. | 428/195 |
| 2002/0098714 | 7/2002 | Grill et al. | |
| 2002/0182894 | 12/2002 | Andideh | 438/796 |
| 2003/0003765 | 1/2003 | Gibson, Jr. et al. | |
| 2003/0022526 | 1/2003 | Vyvoda et al. | 438/788 |
| 2003/0032274 * | 2/2003 | Daniels et al. | 438/597 |
| 2003/0035904 | 2/2003 | Hsieh et al. | 427/569 |
| 2003/0077916 | 4/2003 | Xu et al. | 438/778 |
| 2003/0129827 | 7/2003 | Lee et al. | |
| 2003/0139062 | 7/2003 | Grill et al. | |

* cited by examiner

METHOD OF MODIFYING INTERLAYER ADHESION

BACKGROUND OF THE DISCLOSURE

1. Field of the Invention

The invention relates to the fabrication of integrated circuits and to a process for depositing dielectric layers on a substrate and the structures formed by the dielectric layer.

2. Description of the Related Art

One of the primary steps in the fabrication of modern semiconductor devices is the formation of metal and dielectric layers on a substrate by chemical reaction of gases. Such deposition processes are referred to as chemical vapor deposition or CVD. Conventional thermal CVD processes supply reactive gases to the substrate surface where heat-induced chemical reactions take place to produce a desired layer.

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 $\mu$m and even 0.18 $\mu$m feature sizes, and tomorrow's plants soon will be producing devices having even smaller geometries.

To further reduce the size of devices on integrated circuits, it has become necessary to use conductive materials having low resistivity and to use insulators having low dielectric constants (dielectric constant <4.0) to also reduce the capacitive coupling between adjacent metal lines. One such low k material is spin-on glass, such as un-doped silicon glass (USG) or fluorine-doped silicon glass (FSG), which can be deposited as a gap fill layer in a semiconductor manufacturing process and silicon oxycarbide which can used as a dielectric layer in fabricating damascene features.

One conductive material gaining acceptance is copper and its alloys, which have become the materials of choice for sub-quarter-micron interconnect technology because copper has a lower resistivity than aluminum, (1.7 $\mu\Omega$-cm compared to 3.1 $\mu\Omega$-cm for aluminum), a higher current and higher carrying capacity. These characteristics are important for supporting the higher current densities experienced at high levels of integration and increased device speed. Further, copper has good thermal conductivity and is available in a very pure state.

One difficulty in using copper in semiconductor devices is that copper is difficult to etch and achieve a precise pattern. Etching with copper using traditional deposition/etch processes for forming interconnects has been less than satisfactory. Therefore, new methods of manufacturing interconnects having copper containing materials and low k dielectric materials are being developed.

One method for forming vertical and horizontal interconnects is by a damascene or dual damascene method. In the damascene method, one or more dielectric materials, such as the low k dielectric materials, are deposited and pattern etched to form the vertical interconnects, i.e. vias, and horizontal interconnects, i.e., lines. Conductive materials, such as copper containing materials, and other materials, such as barrier layer materials used to prevent diffusion of, copper containing materials into the surrounding low k dielectric, are then inlaid into the etched pattern. Any excess copper containing materials and excess barrier layer material external to the etched pattern, such as on the field of the substrate, is then removed.

However, when silicon oxycarbide layers and silicon carbide layers are used as the low k material in damascene formation, less than satisfactory interlayer adhesion has been observed during processing. Some techniques for processing substrates may apply forces that can increase layering defects, such as layer delamination. For example, excess copper containing materials may be removed by mechanical abrasion between a substrate and a polishing pad in a chemical mechanical polishing process, and the force between the substrate and the polishing pad may induce stresses in the deposited low k dielectric materials to result in layer delamination. In another example, annealing of deposited materials may induce high thermal stresses that can also lead to delamination in low k dielectric materials.

Therefore, there remains a need for a process for improving interlayer adhesion between low k dielectric layers.

SUMMARY OF THE INVENTION

Aspects of the invention generally provide a method for depositing an adhesion layer having a low dielectric constant between two low k dielectric layers. In one aspect, the invention provides a method for processing a substrate including depositing a barrier layer on the substrate, wherein the barrier layer comprises silicon and carbon and has a dielectric constant less than 4, depositing a dielectric initiation layer adjacent the barrier layer, and depositing a first dielectric layer adjacent the dielectric initiation layer, wherein the dielectric layer comprises silicon, oxygen, and carbon and has a dielectric constant of about 3 or less.

In another aspect of the invention, a method is provided for processing a substrate including depositing a first dielectric layer on the substrate, wherein the first dielectric layer comprises silicon and carbon and is deposited by a process comprising introducing a processing gas having an organo-silicon compound and reacting the processing gas to deposit the first dielectric layer, reducing the carbon content at a surface portion of the first dielectric layer, and then depositing a second dielectric layer adjacent the first dielectric layer, wherein the first dielectric layer comprises silicon, oxygen, and carbon and has a dielectric constant of about 3 or less.

In another aspect of the invention, a method is provided for processing a substrate including depositing a barrier layer on the substrate, wherein the barrier layer is deposited by introducing a processing gas comprising an organosilicon compound into a processing chamber and reacting the processing gas, depositing a barrier layer termination layer adjacent the barrier layer, wherein the barrier layer is deposited by introducing a processing gas comprising an organo-silicon compound and an oxidizing compound into a processing chamber and reacting the processing gas, and depositing a first dielectric layer adjacent the barrier layer termination layer, wherein the dielectric layer comprises silicon, oxygen, and carbon and has a dielectric constant of about 3 or less.

BRIEF DESCRIPTION OF THE DRAWINGS

So that the manner in which the above aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are

Figure 1:
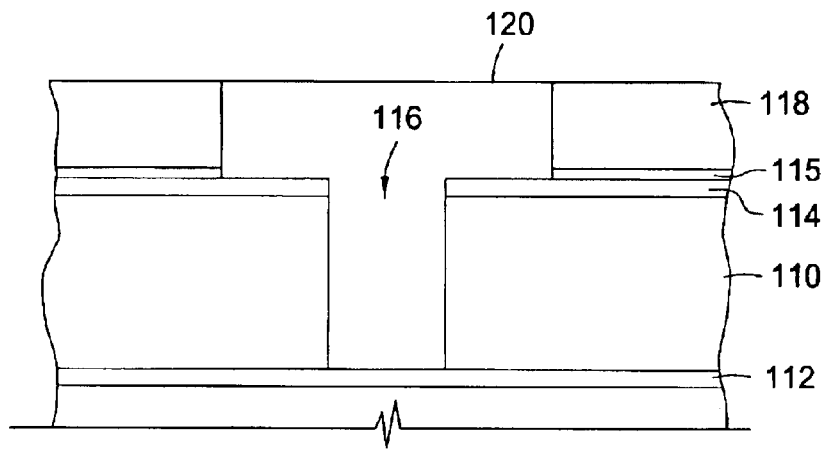
FIG. 1 is a cross-sectional view showing a dual damascene structure comprising the silicon carbide and silicon oxycarbide layers described herein.

For a further understanding of aspect of the invention, reference should be made to the ensuing detailed description.

DETAILED DESCRIPTION OF THE PREFERRED EMBODIMENTS

Aspects of the Invention described herein refer to a method and apparatus for depositing an adhesive dielectric material and/or treating the surface between dielectric layers to improve interlayer adhesion of dielectric layers. Deposition of an adhesive dielectric layer may comprise forming a termination layer on a first dielectric layer or forming a dielectric initiation layer before depositing a subsequent dielectric layer. The adhesive dielectric material may comprise silicon, carbon, and optionally, oxygen. Treatments to improve adhesion between the dielectric layers include modifying the surface of a deposited layer prior to subsequent deposition, for example, the application of an oxidized plasma treatment between dielectric layer depositions. Treating of the surface of a silicon, carbon, and optionally, oxygen containing material is believed to reduce the carbon content from the deposited material to thereby improve interlayer adhesion. While the following description is directed to improving the adhesion between the silicon carbide layers and the silicon oxycarbide layer, the following examples and description should not be construed or interpreted as limiting the scope of the invention.

Silicon Carbide Layers

The silicon and carbon containing layer may comprise a silicon carbide dielectric layer or a doped silicon carbide layer. The silicon carbide layer may be a barrier layer disposed adjacent a conductive material or dielectric layer or may be an etch stop deposited between one or more dielectric layers.

The silicon carbide layer or oxygen doped silicon carbide layer is deposited by reacting an organosilicon compound and, optionally one or more dopants, to form a dielectric layer comprising carbon-silicon bonds and a dielectric constant less than about 4. The silicon and carbon containing layer is preferably an amorphous hydrogenated silicon carbide. The amorphous silicon carbide layer is produced by the reaction of an organosilane compound, or a carbon containing material and a silicon containing material, in a plasma of an inert gas.

The silicon carbide layer may also contain hydrogen, oxygen, nitrogen, or combinations thereof. An oxygen source, such as oxygen, ozone, or an oxygen containing organosilicon precursor, or a nitrogen source, such as ammonia, may be used during the reaction to form the oxygen doped and/or nitrogen doped silicon carbide layers. Oxygen doped silicon carbide generally includes less than about 15 atomic percent (atomic %) of oxygen or less, preferably about 10 atomic % or less of oxygen. Nitrogen doped silicon carbide may comprise up to 20 atomic % of nitrogen.

Suitable organosilane compounds include aliphatic organosilicon compounds, cyclic organosilicon compounds, or combinations thereof. Cyclic organosilicon compounds typically have a ring comprising three or more silicon atoms and the ring may further comprise one or more oxygen atoms. Commercially available cyclic organosilicon compounds include rings having alternating silicon and oxygen atoms with one or two alkyl groups bonded to the silicon atoms.

Aliphatic organosilicon compounds have linear or branched structures comprising one or more silicon atoms and one or more carbon atoms, and the structure may further comprise oxygen. Commercially available aliphatic organosilicon compounds include organosilanes that do not contain oxygen between silicon atoms, and organosiloxanes that contain oxygen between two or more silicon atoms.

Organosilicon compounds contain carbon atoms in organic groups. Low dielectric constant layers are prepared from organosilicon compounds that have one or more carbon atoms attached to silicon wherein the carbon is not readily removed by oxidation at suitable processing conditions. Organic groups may include alkyl, alkenyl, cyclohexenyl, and aryl groups in addition to functional derivatives thereof.

Cyclic organosilicon compounds include, for example, one or more of the following compounds:

| | |
|---|---|
| 1,3,5-trisilano-2,4,6-trimethylene, | –(–$SiH_2$–$CH_2$–)$_3$– (cyclic) |
| 2,4,6,8-tetramethylcyclotetrasiloxane (TMCTS) | –(–$SiHCH_3$–O–)$_4$– (cyclic) |
| octamethylcyclotetrasiloxane (OMCTS), | –(–$Si(CH_3)_2$–O–)$_4$– (cyclic) |
| 2,4,6,8,10-pentamethylcyclopentasiloxane, | –(–$SiHCH_3$–O–)$_5$– (cyclic) |
| 1,3,5,7-tetrasilano-2,6-dioxy-4,8-dimethylene, | –(–$SiH_2$–$CH_2$–$SiH_2$–O–)$_2$– (cyclic) |
| hexamethylcyclotrisiloxane | –(–$Si(CH_3)_2$–O–)$_3$– (cyclic) |

Aliphatic organosilicon compounds include, for example, one or more of the following compounds:

| | |
|---|---|
| methylsilane, | $CH_3$–$SiH_3$ |
| dimethylsilane, | $(CH_3)_2$–$SiH_2$ |
| trimethylsilane, | $(CH_3)_3$–$SiH$ |
| dimethyldimethoxysilane, | $(CH_3)_2$–Si–$(OCH_3)_2$ |
| ethylsilane, | $CH_3$–$CH_2$–$SiH_3$ |
| disilanomethane, | $SiH_3$–$CH_2$–$SiH_3$ |
| bis(methylsilano)methane, | $CH_3$–$SiH_2$–$CH_2$–$SiH_2$–$CH_3$ |
| 1,2-disilanoethane, | $SiH_3$–$CH_2$–$CH_2$–$SiH_3$ |
| 1,2-bis(methylsilano)ethane, | $CH_3$–$SiH_2$–$CH_2$–$CH_2$–$SiH_2$–$CH_3$ |
| 2,2-disilanopropane, | $SiH_3$–$C(CH_3)_2$–$SiH_3$ |
| 1,3-dimethyldisiloxane, | $CH_3$–$SiH_2$–O–$SiH_2$–$CH_3$ |
| 1,1,3,3-tetramethyldisiloxane, | $(CH_3)_2$–SiH–O–SiH–$(CH_3)_2$ |
| hexamethyldisiloxane (HMDS), | $(CH_3)_3$–Si–O–Si–$(CH_3)_3$ |
| 1,3-bis(silanomethylene) disiloxane, | $(SiH_3$–$CH_2$–$SiH_2$–)$_2$–O |
| bis(1-methyldisiloxanyl) methane, | $(CH_3$–$SiH_2$–O–$SiH_2$–)$_2$–$CH_2$ |
| 2,2-bis(1-methyldisiloxanyl) propane, | $(CH_3$–$SiH_2$–O–$SiH_2$–)$_2$–$C(CH_3)_2$, and |

| | |
|---|---|
| -continued | |
| hexamethoxydisiloxane (HMDOS) | $(CH_3O)_3$—Si—O—Si—$(OCH_3)_3$. |

The above list is illustrative and should not be construed or interpreted as limiting the scope of the invention.

Generally, the organosilicon compounds are reacted in a plasma comprising a relatively inert gas, such as nitrogen ($N_2$), and preferably a noble gas such as helium or argon. The deposited silicon carbide layers have dielectric constants of about 5 or less, and the doped silicon carbide layers may have dielectric constants of about 3 or less.

A preferred silicon carbide layer is deposited in one embodiment by supplying trimethylsilane to a plasma processing chamber at a flow rate between about 10 and about 5000 standard cubic centimeters per minute (sccm). An inert gas, such as helium, argon, or combinations thereof, is also supplied to the chamber at a flow rate between about 50 sccm and about 5000 sccm. The chamber pressure is maintained between about 100 milliTorr and about 15 Torr. The substrate surface temperature is maintained between about 100° C. and about 450° C. during the deposition process.

Alternatively, a doped silicon carbide layer can be deposited by introducing an oxygen source and/or a nitrogen source, or other dopant, into the processing chamber at a flow rate between about 50 sccm and about 10,000 sccm. For example, a nitrogen containing or nitrogen doped silicon carbide layer may be deposited by introducing a nitrogen source, such as ammonia, nitrogen, a mixture of nitrogen and hydrogen, or combinations thereof, during deposition. An example process for depositing a nitrogen containing silicon carbide layer is disclosed in U.S. patent application Ser. No. 09/793,818, filed on Feb. 23, 2001 U.S. Pat. No. 6,537,733, which is incorporated by reference to the extent not inconsistent with the claims and disclosure described herein. An example process for depositing an oxygen containing silicon carbide layer is disclosed in U.S. patent application Ser. No. 10/196,498, filed on Jul. 15, 2002 U.S. Patent Application Publication No. 20030129827, which is incorporated by reference to the extent not inconsistent with the claims and disclosure described herein.

The organosilicon compound, inert gas, and optional dopant, are introduced to the processing chamber via a gas distribution plate spaced between about 200 millimeters (mm) and about 600 millimeters from the substrate on which the silicon carbide layer is being deposited. Power may be applied for a single or dual frequency RF power source. For example, power from a single 13.56 MHz RF power source is supplied to the chamber 10 to form the plasma at a power density between about 0.3 watts/$cm^2$ and about 3.2 watts/$cm^2$, or a power level between about 100 watts and about 1000 watts for a 200 mm substrate. A power density between about 0.9 watts/$cm^2$ and about 2.3 watts/$cm^2$, or a power level between about 300 watts and about 700 watts for a 200 mm substrate, is preferably supplied to the processing chamber to generate the plasma.

Additionally, the ratio of the silicon source to the dopant in the gas mixture should have a range between about 1:1 and about 100:1. The above process parameters provide a deposition rate for the silicon carbide layer in a range between about 100 Å/min and about 3000 Å/min when implemented on a 200 mm (millimeter) substrate in a deposition chamber available from Applied Materials, Inc., located in Santa Clara, Calif.

The embodiments described herein for depositing silicon carbide layers are provided to illustrate the invention, the particular embodiment shown should not be used to limit the scope of the invention. The invention also contemplates other processes and materials used to deposit silicon carbide layers.

Silicon Oxycarbide Layers

The silicon oxycarbide layer generally comprises between about 15 atomic % or greater of oxygen in the layer. The silicon oxycarbide layer may also contain hydrogen, nitrogen, or combinations thereof.

A preferred silicon oxycarbide layer comprises silicon-oxygen bonds and silicon-carbon bonds that contribute to low dielectric constants and barrier properties. The carbon content of the deposited layer is between about 5 and about 30 atomic % excluding hydrogen atoms, and is preferably between about 10 and about 20 atomic % excluding hydrogen atoms. The deposited layers may contain C—H or C—F bonds throughout to provide hydrophobic properties to the silicon oxycarbide layer.

The silicon oxycarbide layers are produced from organosilicon compounds containing carbon in organo groups that are not readily removed by oxidation at processing conditions. Suitable organosilicon compounds are described above and include aliphatic organosilicon compounds, cyclic organosilicon compounds, or combinations thereof. For example, suitable organo groups include alkyl, alkenyl, cyclohexenyl, and aryl groups and functional derivatives.

In a preferred aspect of the invention, the silicon oxycarbide layer is deposited by reacting an organosilicon compound comprising three or more alkyl groups with an oxidizing gas comprising ozone. The silicon oxycarbide layer may be deposited without an oxidizer if the organosilicon compound includes oxygen. The preferred organosilicon compounds include, for example:

| | |
|---|---|
| trimethylsilane, | $(CH_3)_3$—SiH |
| tetramethylsilane, | $(CH_3)_4$—Si |
| 1,1,3,3-tetramethyldisiloxane, | $(CH_3)_2$—SiH—O—SiH—$(CH_3)_2$ |
| hexamethyldisiloxane, | $(CH_3)_3$—Si—O—Si—$(CH_3)_3$ |
| 2,2-bis (1-methyldisiloxanyl)propane, | $(CH_3$—$SiH_2$—O—$SiH_2$—$)_2$—$C(CH_3)_2$ |
| 1,3,5,7-tetramethylcyclotetrasiloxane, | $\text{—(SiHCH}_3\text{—O—)}_4$— (cyclic) |
| octamethylcyclotetrasiloxane, | $\text{—(Si(CH}_3)_2\text{—O—)}_4$— (cyclic) |
| 1,3,5,7,9-pentamethylcyclopentasiloxane, and fluorinated derivatives thereof. | $\text{—(SiHCH}_3\text{—O—)}_5$— (cyclic) |

The organosilicon compounds are oxidized during deposition of the silicon oxycarbide layer, preferably by reaction with oxygen ($O_2$), ozone ($O_3$), nitrous oxide ($N_2O$), carbon monoxide (CO), carbon dioxide ($CO_2$), water ($H_2O$), or combinations thereof. When ozone is used as an oxidizing gas, an ozone generator typically converts about 15 wt. % of the oxygen in a source gas to ozone, with the remainder typically being oxygen. However, the ozone concentration may be increased or decreased based upon the amount of ozone desired and the type of ozone generating equipment used. Organosilicon compounds that contain oxygen may be disassociated to provide the oxygen. During deposition of the silicon oxycarbide layer, the substrate is maintained at a temperature between about −20° C. and about 500° C., and preferably is maintained at a temperature between about 170° C. and about 180° C.

For a plasma enhanced deposition of the silicon oxycarbide layer, the organosilicon material is deposited using a power density ranging between about 0.03 W/$cm^2$ and about 6.4 W/$cm^2$, which is a RF power level of between about 10

W and about 2000 W for a 200 mm substrate. Preferably, the RF power level is between about 300 W and about 1700 W. The RF power is provided at a frequency between about 0.01 MHz and 300 MHz. The RF power may be provided continuously or in short duration cycles wherein the power is on at the stated levels for cycles less than about 200 Hz, and the on cycles total between about 10% and about 50% of the total duty cycle. The deposition process of the low dielectric constant layer is performed in a substrate processing system described in more detail below. The silicon oxycarbide layer can be deposited continuously or with interruptions, such as changing chambers or providing cooling time, to improve porosity.

In one aspect, a cyclic organosilicon compound and an aliphatic organosilicon compound are reacted with an oxidizing gas in amounts sufficient to deposit a low dielectric constant layer on a semiconductor substrate, wherein the cyclic organosilicon compound comprises at least one silicon-carbon bond. The aliphatic organosilicon compound contains a silicon-hydrogen bond or a silicon-oxygen bond, preferably a silicon-hydrogen bond. For example, the cyclic organosilicon compound may be 1,3,5,7-tetramethylcyclotetrasiloxane or octamethylcyclotetrasiloxane and the aliphatic organosilicon compound may be trimethylsilane or 1,1,3,3-tetramethyldisiloxane.

In another aspect, both the cyclic organosilicon compound and the aliphatic organosilicon compound contain a silicon-hydrogen bond. For example, 1,3,5,7-tetramethylcyclotetrasiloxane and trimethylsilane or 1,1,3, 3-tetramethyldisiloxane are blended and oxidized while applying RF power.

In one embodiment of plasma enhanced deposition, oxygen or oxygen containing compounds are dissociated to increase reactivity and to achieve desired oxidation of the deposited layer. RF power is coupled to the deposition chamber to increase dissociation of the compounds. The compounds may also be dissociated in a microwave chamber prior to entering the deposition chamber.

Although deposition preferably occurs in a single deposition chamber, the silicon oxycarbide layer can be deposited sequentially in two or more deposition chambers, e.g., to permit cooling of the layer during deposition. Additionally, the silicon oxycarbide and silicon carbide layers may be deposited in situ in the same chamber and deposited subsequently by using selective precursors and controlling the processing parameters and the composition of processing gases. For example, both the silicon carbide and silicon oxycarbide layer may be deposited using trimethylsilane with ammonia being used in the silicon carbide deposition to form a nitrogen doped silicon carbide, and subsequently using ozone during deposition of the silicon oxycarbide material.

Termination and Initiation Layers

In one aspect, interlayer adhesion may be improved by depositing a termination layer on the silicon carbide layer or a dielectric initiation layer prior to depositing the silicon oxycarbide layer.

A termination layer may be deposited on the silicon carbide layer in order to improve subsequent deposition of dielectric materials. The termination layer may be deposited in situ by increasing the oxygen concentration of the silicon carbide process gas to form a doped silicon carbide layer or a doped silicon carbide layer with increased oxygen content compared to a prior layer. The oxygen concentration may be increased by using an oxidizing gas, an oxygen-containing organosilicon precursor, or both, and may be used in greater amounts than the initial silicon carbon layer if that layer is also an oxygen doped silicon carbide layer. For example, the oxygen content of the oxygen doped silicon carbide layer may be between about 3 atomic percent (atomic %) and about 10 atomic %. The increased oxygen concentration is believed to remove carbon content from the deposited film as well as to density the silicon carbide surface to improve interlayer adhesion. The termination layer may be deposited at a thickness between about 100 Å and about 1000 Å.

A dielectric initiation layer may be deposited on the silicon carbide layer to seed the deposition of a silicon oxycarbide layer. The dielectric initiation layer is deposited with a carbon-containing oxidizing compound and a nitrating compound used with an organosilicon precursor instead of an oxidizing agent to deposit the layer at processing conditions approximately or equivalent to the silicon oxycarbide deposition. The carbon-containing oxidizing compound may include carbon dioxide, carbon monoxide, and combinations thereof. The nitrogen-containing compound may include ammonia, ammonia derivatives, hydrazine, a mixture of hydrogen and nitrogen, and combinations thereof. The dielectric initiation layer and silicon oxycarbide layer may be deposited in situ by modifying the oxidizing gas and terminating or reducing the flow of nitrogen-containing compound. It was unexpectedly discovered that the use of both a carbon-containing oxidizing compound and a nitrating compound significantly improved adhesion compared to using just one of the components in forming a dielectric initiation layer.

An example of a deposition of dielectric initiation layer in one embodiment is as follows. A processing gas of a carbon-containing oxidizing compound and a nitrating compound, and an organosilicon precursor organosilicon is supplied to the processing chamber. Organosilicon compounds, such as trimethylsiiane and/or 1.3,5,7-tetramethylcyclotetrasiloxane, are supplied to a plasma processing chamber at a flow rate between about 100 milligrams/minute (mgm) and about 5000 mgm, respectively, a carbon-containing oxidizing compound is supplied at a flow rate between about 10 sccm and about 2000 sccm, a nitrating compound is supplied at a flow rate between about 10 sccm and about 2000 sccm, and optionally, a noble gas is supplied at a flow rate between about 1 scorn and about 10000 sccm. The chamber is maintained at a substrate temperature between about 0° C. and about 500° C. and a chamber pressure is maintained between about 100 milliTorr and about 100 Torr with an applied RF power of between about 0.03 watts/cm$^2$ and about 1500 watts/cm$^2$. The processing gas may be introduced into the chamber by a gas distributor. The gas distributor may be positioned between about 200 mils and about 700 mils from the substrate surface.

The RF power can be provided at a high frequency such as between 13 MHz and 14 MHz or a mixed frequency of the high frequency and the low frequency. For example, a high frequency of about 13.56 MHz may be used as well as a mixed frequency with a high frequency of about 13.56 MHz and a low frequency of about 356 KHz. The RF power can be provided continuously or in short duration cycles wherein the power is on at the stated levels for cycles less than about 200 Hz, and the on cycles total between about 10% and about 30% of the total duty cycle. Additionally, a low frequency RF power may be applied during the deposition process. For example, an application of less than about 300 watts, such as less than about 100 watts at between about 100 KHz and about 1 MHz, such as 356 KHz may be used to modify film properties, such as increasing the compressive stress of a SiC film to reduce copper stress migration.

An increased amount of inert gas used for depositing the termination layer compared to the silicon carbide layer, and an increased amount of inert gas in the dielectric initiation layer compared to the silicon oxycarbide layer was also observed to improve interlayer adhesion.

Deposition Concurrent Treatments to Improve Interlayer Adhesion

It is believed that reducing the carbon content at the interface between the silicon carbide layers and silicon oxycarbide layers improves interlayer adhesion. Modification of processing variables during deposition is believed to affect carbon content and thus adhesion.

For example, in another aspect, a dielectric initiation layer may be deposited with an organosilicon compound and an oxidizing compound, by the modification of one or more processing variables. Decreasing spacer heating and increasing deposition temperatures during dielectric initiation layer deposition were also observed to result in improving adhesion with silicon carbide layers. Additionally, decreasing organosilicon precursor flow rates during dielectric initiation layer deposition was observed to result in increasing adhesion with silicon carbide materials. Furthermore, depositing a dielectric initiation layer of silicon oxycarbide at increasing deposition rates compared to the subsequently deposited silicon oxycarbide layer has been observed to increase adhesion with silicon carbide layers.

Also, it has been observed that dual frequency RF power sources used for the deposition of the dielectric initiation layer will improve adhesion compared to single frequency RF power sources and/or applications, assuming all other processing parameters are constant.

Post-Deposition Treatments to Improve Interlayer Adhesion

Following deposition, each deposited dielectric material may be annealed at a temperature between about 100° C. and about 400° C. for between about 1 minute and about 60 minutes, preferably at about 30 minutes, to reduce the moisture content and increase the solidity and hardness of the dielectric material, if desired. The anneal is preferably performed after the deposition of the next layer which prevents shrinkage or deformation of the dielectric layer. Inert gases, such as argon and helium, may be added to the annealing atmosphere.

The deposited silicon oxycarbide layer or silicon carbide layer may also be plasma treated prior to deposition of resist material thereon. The plasma treatment is believed to remove a portion of the carbon material from the surface of the silicon oxycarbide layer or silicon carbide layer that reduces the surface's reactivity to subsequently deposited materials. The plasma treatment may be performed in the same chamber used to deposit the silicon and carbon containing material.

The plasma treatment generally includes providing an inert gas including helium, argon, neon, xenon, krypton, or combinations thereof, to a processing chamber at a flow rate between about 500 sccm and about 3000 sccm, and generating a plasma in the processing chamber. Optionally, an oxidizing gas, such as oxygen, may be used with or instead of the inert gas in a post-deposition treatment process. The plasma may be generated using a power density ranging between about 0.03 W/cm$^2$ and about 3.2 W/cm$^2$, which is a RF power level of between about 10 W and about 1000 W for a 200 mm substrate. Preferably, a power level of between about 200 watts and about 800 watts is used in depositing the silicon carbide material for a 200 mm substrate. The RF power can be provided at a high frequency such as between 13 MHz and 14 MHz. The RF power can be provided continuously or in short duration cycles wherein the power is on at the stated levels for cycles less than about 200 Hz, and the on cycles total between about 10% and about 30% of the total duty cycle.

The processing chamber is generally maintained at a chamber pressure of between about 3 Torr and about 12 Torr, such as a chamber pressure between about 7 Torr and about 10 Torr. The substrate is maintained at a temperature between about 300° C. and about 450° C. during the plasma treatment. A substrate temperature between about 350° C. and about 400° C. may be used during the plasma treatment. The plasma treatment may be performed between about 3 seconds and about 120 seconds, with a plasma treatment between about 5 seconds and about 40 seconds preferably used. The processing gases may be introduced into the processing chamber through a gas distributor, or "showerhead" that may be positioned between about 200 mils and about 1000 mils, for example between 300 mils and 500 mils from the substrate surface. Showerhead positioning between about 300 mils and about 400 mils from the substrate during the plasma treatment has been observed to produce effective plasma treatment by the processing gases on the substrate surface.

However, it should be noted that the respective parameters may be modified to perform the plasma processes in various chambers and for different substrate sizes, such as 300 mm substrates. An example of a plasma treatment for a silicon and carbon containing film is further disclosed in U.S. patent application Ser. No. 09/336,525, entitled, "Plasma Treatment to Enhance Adhesion and to Minimize Oxidation of Carbon-Containing Layers," filed on Jun. 18, 1999 U.S. Pat. No. 6,821,571, which is incorporated by reference to the extent not inconsistent with the disclosure and claimed aspects of the invention described herein.

E-Beam Treatment

In another aspect of the invention, deposited silicon carbide layers and silicon oxycarbide layers may be cured by an electronic beam (e-beam) technique to improve interlayer adhesion. The e-beam treatment may be performed in situ within the same processing system, for example, transferred from one chamber to another without a break in a vacuum. While the best results for adhesion have been observed by e-beam treatment of stacks of the silicon carbide layers and silicon oxycarbide layers, individual silicon carbide layers and silicon oxycarbide layers may be treated to improve adhesion to adjacent layers.

An e-beam treatment of a silicon carbide layer may comprise the application or exposure to a dosage between about 50 micro coulombs per square centimeter ($\mu C/cm^2$) and about 1600 $\mu C/cm^2$, for example, about 800 $\mu C/cm^2$, at energy ranges between about 0.5 kiloelectron volts (KeV) and about 30 KeV, for example between about 4 KeV and about 10 KeV, such as 8 KeV. Dosages may vary on the size of the substrate being treated, for example, a dosage between about 50 $\mu C/cm^2$ and about 1600 $\mu C/cm^2$ has been observed to result in adhesion of layers formed on 300 mm substrates and a dosage between about 200 $\mu C/cm^2$ and about 800 $\mu C/cm^2$ has been observed to result in adhesion of layers formed on 200 mm substrates.

The electron beams are generally generated at a pressure of about 1 mTorr to about 100 mTorr. A gas ambient may include an inert gas, including nitrogen, helium, argon, xenon, an oxidizing gas including oxygen, a reducing gas including hydrogen, a blend of hydrogen and nitrogen, ammonia, or any combination of these gases. The electron beam current ranges from about 1 mA to about 40 mA, and more preferably from about 2 mA to about 20 mA. The electron beam may cover an area from about 4 square inches to about 700 square inches. The e-beam process apparatus 200 operates ranges from about −200 degrees Celsius to about 600 degrees Celsius, e.g., about 400 degrees Celsius.

Although any e-beam device may be used, one exemplary device is the EBK chamber, available from Applied Materials, Inc., of Santa Clara Calif. E-beam processing is more fully described in U.S. patent application Ser. No. 10/302,375 (AMAT 7625), entitled, "Method For Curing Low Dielectric Constant Film By Electron Beam", filed on Nov. 22, 2002, and incorporated by reference to the extent not inconsistent with the claims, aspects, and disclosure herein.

Deposition of a Dual Damascene Structure

A damascene structure that is formed using the plasma treatment described herein for a silicon oxycarbide layer disposed on a silicon carbide layer is shown in FIG. 1.

While the following interlayer adhesion processes described herein is used between a low k etch stop layer 114 and an interlayer dielectric layer 118, the invention contemplates that the interlayer adhesion processes may be used between any suitable dielectric layers in a damascene structure, such as between silicon carbide barrier layer 112 and dielectric layer 110. Alternatively, while not shown, the invention contemplates that the adhesion improving layer and techniques described herein may be used to improve adhesion between a silicon oxycarbide layer and a silicon carbide layer deposited on top of the silicon oxycarbide layer, for example between layers 110 and 114.

A silicon oxycarbide material is deposited from an oxidized organosilicon compound by the process described herein, as an interlayer dielectric material, such as the first dielectric layer 110. A first silicon carbide barrier layer 112 is generally deposited on the substrate surface to eliminate inter-level diffusion between the substrate and subsequently deposited material. The first silicon carbide barrier layer 112 may be nitrogen and/or oxygen doped. A capping layer of nitrogen free silicon carbide (not shown) may be deposited in situ on the first silicon carbide barrier layer 112 by minimizing or eliminating the nitrogen source gas.

The first dielectric layer 110 of the oxidized organosilicon compound is deposited on a first silicon carbide barrier layer 112 on the substrate surface. The first dielectric layer 110 may then be plasma treated or e-beam treated according to the processes described herein. Alternatively, a silicon oxide cap layer (not shown) may be deposited in situ on the first dielectric layer 110 by increasing the oxygen concentration in the silicon oxycarbide deposition process described herein to remove carbon from the deposited material.

An etch stop (or second barrier layer) 114 of a silicon carbide, which may be doped with nitrogen or oxygen, is then deposited on the first dielectric layer 110. The etch stop 114 may have a nitrogen free silicon carbide capping layer deposited thereon. The etch stop 114 is then pattern etched to define the openings of the contacts/vias 116. An interlayer adhesion layer or surface 115 may be formed on the layer 114 prior to subsequent processing, such as etching or additional dielectric etching, to improve interlayer adhesion with subsequently deposited dielectric materials. The improved adhesion layer may comprise the dielectric initiation layer or the silicon carbide termination layer as described herein. The interlayer adhesion surface may be formed by the techniques described herein. A second dielectric layer 118 of an oxidized organosilane or organosiloxane is then deposited over the patterned etch stop.

The second dielectric layer 118 is then plasma treated according to the process described herein or has a silicon oxide cap material disposed thereon by the process described herein. A resist, conventionally known in the art, such as photoresist material UV-5, commercially available from Shipley Company Inc., of Marlborough, Mass., is then deposited and patterned by conventional means known in the art to define the interconnect lines 120. A single etch process is then performed to define the interconnect down to the etch stop and to etch the unprotected dielectric exposed by the patterned etch stop to define the contacts/vias.

Figure 2A:
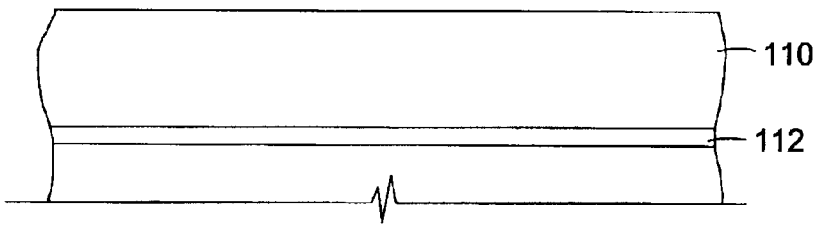
FIGS. 2A–2H are cross-sectional views showing one embodiment of a dual damascene deposition sequence of the invention.
Figure 2B:
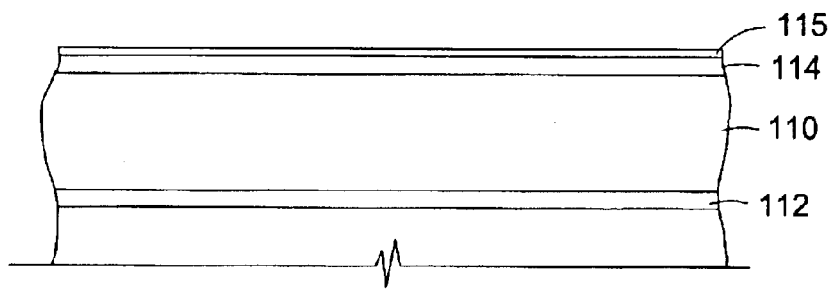
Figure 2C:
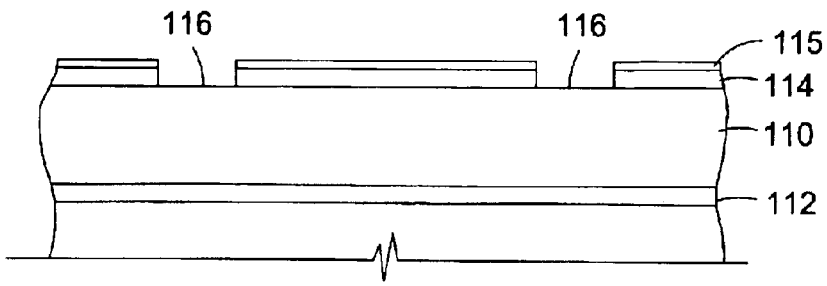
Figure 2D:
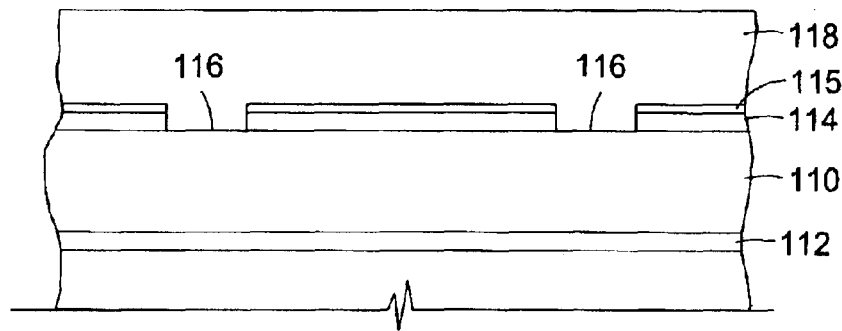
Figure 2E:
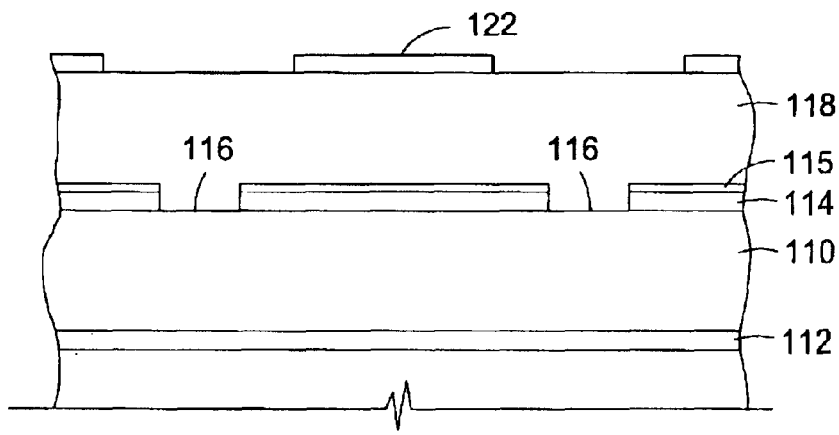

A preferred dual damascene structure fabricated in accordance with the invention includes the plasma treatment or e-beam treatment of an exposed silicon oxycarbide layer as shown in FIG. 2E, and the method of making the structure is sequentially depicted schematically in FIGS. 2A–2H, which are cross-sectional views of a substrate having the steps of the invention formed thereon.

As shown in FIG. 2A, a first silicon carbide barrier layer 112 is deposited on the substrate surface. The silicon carbide material of the first silicon carbide barrier layer 112 may be doped with nitrogen and/or oxygen. While not shown, a capping layer of nitrogen free silicon carbide or silicon oxide may be deposited on the barrier layer 112. The nitrogen free silicon carbide or silicon oxide may be deposited in situ by adjusting the composition of the processing gas. The first silicon carbide barrier layer 112 may be plasma treated with an inert gas. Helium (He), argon (Ar), neon (Ne), and combinations thereof, may be used for the inert gas. The plasma treatment may be performed in situ with the deposition of the silicon carbide barrier layer 112.

In general, the following process parameters can be used to plasma treat the first silicon carbide barrier layer 112. The process parameters range from a chamber pressure of about 1 Torr to about 10 Torr, an inert gas flow rate of about 1000 sccm to about 7000 sccm, and a radio frequency (RF) power of about 1 watt/cm$^2$ to about 10 watts/cm$^2$. The silicon carbide layer barrier layer 112 is plasma treated for less than about 120 seconds.

An initial first dielectric layer 110 of silicon oxycarbide from an oxidized organosilane or organosiloxane by the process described herein, such as trimethylsilane, is deposited on the first silicon carbide barrier layer 112 to a thickness of about 5,000 to about 15,000 Å, depending on the size of the structure to be fabricated. The first dielectric layer may also comprise other low k dielectric material such as a low polymer material including parylene or a low k spin-on glass such as un-doped silicon glass (USG) or fluorine-doped silicon glass (FSG). The first dielectric layer may then be treated by a plasma process as described herein.

As shown in FIG. 2B, the low k etch stop 114, which may be nitrogen and/or oxygen doped silicon carbide, is then deposited on the first dielectric layer to a thickness of about 100 Å to about 1000 Å. An interlayer dielectric adhesion layer or surface 115 formed by one of the processes described herein, such as a dielectric initiation layer, is then formed or deposited on the low k etch stop layer 114. The low k etch stop 114 and/or interlayer dielectric adhesion layer or surface 115 may be plasma treated as described herein for the silicon carbide materials or silicon oxycarbide materials.

The low k etch stop 114 is then pattern etched to define the contact/via openings 116 and to expose first dielectric layer 110 in the areas where the contacts/vias are to be formed as shown in FIG. 2C. Preferably, the low k etch stop 114 is pattern etched using conventional photolithography and etch processes using fluorine, carbon, and oxygen ions. While not shown, a nitrogen-free silicon carbide or silicon oxide cap layer between about 100 Å to about 500 Å may be deposited on the low k etch stop 114 and/or interlayer dielectric adhesion layer or surface 115 prior to depositing further materials.

After low k etch stop 114 has been etched to pattern the contacts/vias and the resist material has been removed, a second dielectric layer 118 of silicon oxycarbide from an oxidized organosilane or organosiloxane by the process described herein, such as trimethylsilane, is deposited to a thickness of about 5,000 to about 15,000 Å as shown in FIG. 2D. The second dielectric layer 118 is then plasma treated with helium as described herein for first dielectric layer 110.

Figure 2F:
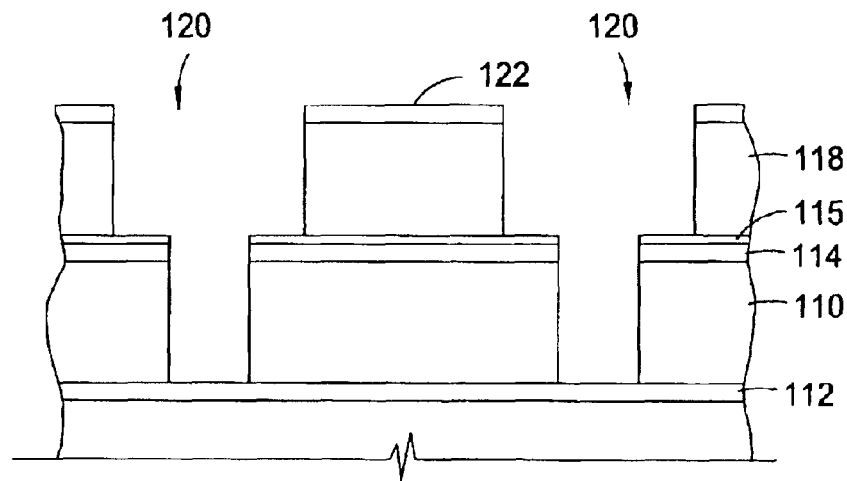

A resist material 122 is then deposited on the second dielectric layer 118 (or cap layer) and patterned preferably using conventional photolithography processes to define the interconnect lines 120 as shown in FIG. 2E. The resist material 122 comprises a material conventionally known in the art, preferably a high activation energy resist material, such as UV-5, commercially available from Shipley Company Inc., of Marlborough, Mass. The interconnects and contacts/vias are then etched using reactive ion etching or other anisotropic etching techniques to define the metallization structure (i.e., the interconnect and contact/via) as shown in FIG. 2F. Any resist material or other material used to pattern the etch stop 114 or the second dielectric layer 118 is removed using an oxygen strip or other suitable process.

Figure 2G:
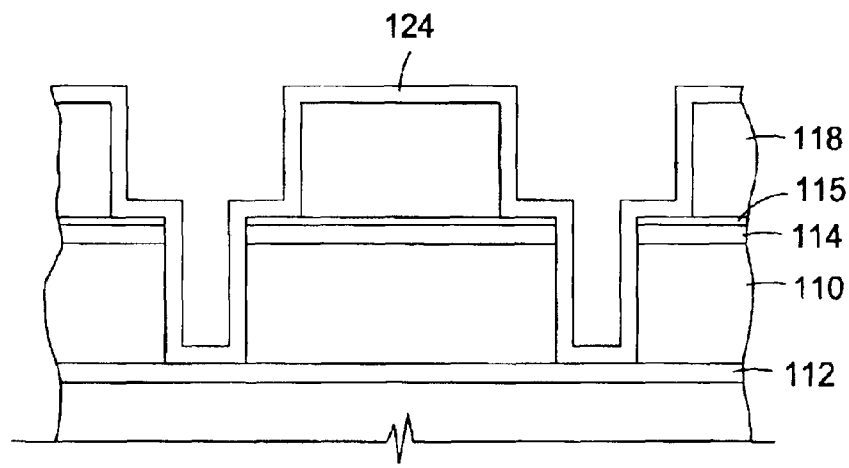
Figure 2H:
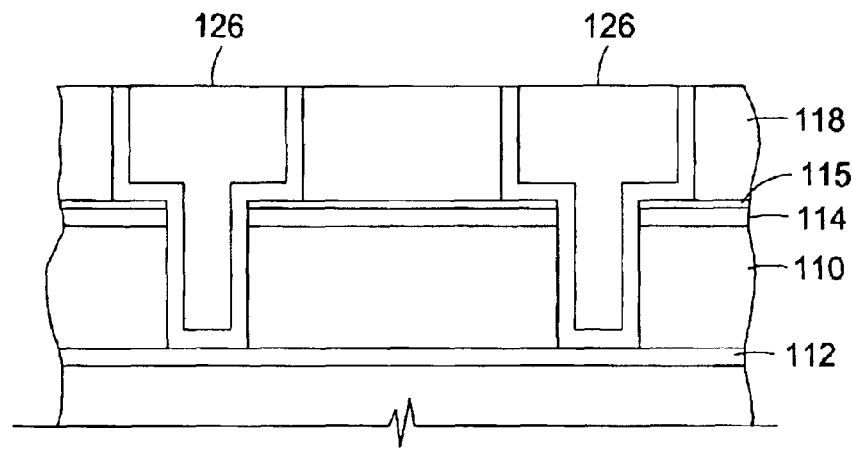

The metallization structure is then formed with a conductive material such as aluminum, copper, tungsten or combinations thereof. Presently, the trend is to use copper to form the smaller features due to the low resistivity of copper (1.7 mW-cm compared to 3.1 mW-cm for aluminum). Preferably, as shown in FIG. 2G, a suitable barrier layer 124, such as tantalum nitride, is first deposited conformally in the metallization pattern to prevent copper migration into the surrounding silicon and/or dielectric material. Thereafter, copper 126 is deposited using either chemical vapor deposition, physical vapor deposition, electroplating, or combinations thereof to form the conductive structure. Once the structure has been filled with copper or other metal, the surface is planarized using chemical mechanical polishing, as shown in FIG. 2H.

EXAMPLES

The following examples demonstrate various embodiments of the adhesion processes described herein as compared to a standard interlayer stack to illustrate the improved interlayer adhesion. These examples were undertaken using a chemical vapor deposition chamber, and in a Centura DxZ™ or Producer™ system which includes a solid-state RF matching unit with a two-piece quartz process kit, both fabricated and sold by Applied Materials, Inc., Santa Clara, Calif.

Base Interlayer Stack and Adhesion Test

Test samples were prepared as follows. A stack of dielectric layers were deposited on a silicon substrate as follows: a first layer of silicon carbide as described herein was deposited to about 1000 Å thick on the silicon substrate, about 5000 Å of a silicon oxycarbide dielectric layer as described herein was deposited on the first silicon carbide layer, and a second layer of silicon carbide as described herein was deposited to about 1000 Å thick on the silicon oxycarbide layer.

The silicon carbide layers were deposited by introducing trimethylsilane (TMS) at a flow rate of 160 sccm, helium at a flow rate of 400 sccm, and ammonia at a flow rate of 325 sccm into a processing chamber being operated at a temperature of 350° C., a pressure of 3 Torr, and a RF power of 300 watts with a heater spacing of about 300 mils between the heater and a substrate, to deposit the material.

The silicon oxycarbide layer was deposited by introducing trimethylsilane (TMS) at a flow rate of 1400 sccm, helium at a flow rate of 400 sccm, and oxygen at a flow rate of 400 sccm into a processing chamber being operated at a temperature of 350° C., a pressure of 5 Torr, and a RF power of 700 watts with a heater spacing of about 360 mils between the heater and a substrate, to deposit the material.

Adhesion testing was performed on the test samples as follows. Between about 120 μm and about 150 μm of epoxy material with known delamination characteristics were deposited on the test samples. The test samples were then baked or cured for one hour at approximately 190° C. and then cleaved into 1 cm by 1 cm samples and cooled to −170° C. with liquid nitrogen. The samples were then observed to determine delamination, which occurs at a weakest interlayer interface at a given temperature. The shrinkage of the epoxy at a given temperature correlates to the forces that are required to induce peeling. From this observation, a determination of adhesion can be calculated. Adhesion (kic) is based on the formula σ√(h/2), with h being the epoxy thickness and being the residual stress. The measured adhesion (kic) of an untreated or unmodified stack described above was about 0.22 Mpa-m$^{1/2}$.

Examples of the above processes and the corresponding adhesion values are as follows.

RF Frequency

Single and dual frequency deposition of a dielectric initiation layers were prepared as follows. Single frequency dielectric initiation layer was deposited by introducing trimethylsilane (TMS) at a flow rate of 600 sccm, helium at a flow rate of 1200 sccm, oxygen at a flow rate of 1000 sccm, acetylene ($C_2H_4$) at a flow rate of 1000 sccm, and OMCTS at a flow rate of 4000 mgm, into a processing chamber being operated at a temperature of 400° C., a pressure of 3.5 Torr, and a RF power of 1100 watts high frequency RF power, with a heater spacing of about 350 mils between the heater and a substrate to deposit the material.

The measured adhesion (kic) of the single frequency dielectric initiation layer was observed to be about 0.3 Mpa-m$^{1/2}$. The dielectric constant was measured to be 3.28, the hardness of the deposited layer was 2.68 GPa, and the layer modulus was measured to be 17.3 GPa.

A dual frequency dielectric initiation layer was deposited by introducing trimethylsilane (TMS) at a flow rate of 300 sccm, helium at a flow rate of 600 sccm, oxygen at a flow rate of 300 sccm, acetylene ($C_2H_4$) at a flow rate of 500 sccm, and OMCTS at a flow rate of 2000 mgm, into a processing chamber being operated at a temperature of 400° C. a pressure of 4.5 Torr, and a RF power of 400 watts high frequency RF power and 150 low frequency RF power, with a heater spacing of about 350 mils between the heater and a substrate to deposit the material.

The measured adhesion (kic) of the dual frequency dielectric initiation layer was observed to be about 0.29 Mpa-m$^{1/2}$. The dielectric constant was measured to be 2.96, the hardness of the deposited layer was 2.03 GPa, and the layer modulus was measured to be 12.27 GPa.

Generally, it has been observed that dual frequency layer adhesion is improved over single frequency layer adhesion. Further it has also been observed that increasing power levels result in increased adhesion. Additionally, increasing dielectric constants, hardness and modulus can result in increased adhesion. In relation to the above examples, the single frequency layer adhesion, 0.3 Mpa-m$^{1/2}$, was observed to be greater than the dual frequency layer adhesion, 0.29 Mpa-m$^{1/2}$, however, the power level of the single frequency layer 1110 W was greater than the dual frequency layer 400 W/150 W and the dielectric constant of the dual frequency layer adhesion, 2.96, was improved over the single frequency dielectric constant, 3.28. Under such dielectric layer property trends, processes for depositing dielectric layers may be modified to provide for desired dielectric layer properties such as improved dielectric constant with reduced adhesion, or improved adhesion with less than optimal dielectric properties.

Doped Dielectric Initiation Layer

Comparison of dielectric initiation layer to improve interlayer adhesion with the addition of dopants. A carbon dioxide additive only dielectric initiation layer was deposited by introducing trimethylsilane (TMS) at a flow rate of 1400 sccm, helium at a flow rate of 400 sccm, carbon dioxide at a flow rate of 400 sccm, into a processing chamber being operated at a temperature of 350° C., a pressure of 5 Torr, a RF power of 700 watts, with a heater spacing of about 360 mils between the heater and a substrate to deposit the material. The measured adhesion (kic) was about 0.21 $Mpa\text{-}m^{1/2}$.

An ammonia additive only dielectric initiation layer was deposited by introducing trimethylsilane (TMS) at a flow rate of 1400 sccm, helium at a flow rate of 400 sccm, ammonia at a flow rate of 325 sccm, into a processing chamber being operated at a temperature of 350° C., a pressure of 5 Torr, a RF power of 700 watts, with a heater spacing of about 360 mils between the heater and a substrate to deposit the material. The measured adhesion (kic) was about 0.26 $Mpa\text{-}m^{1/2}$.

A carbon dioxide and ammonia additive dielectric initiation layer was deposited by introducing trimethylsilane (TMS) at a flow rate of 1400 sccm, helium at a flow rate of 400 sccm, carbon dioxide at a flow rate of 400 sccm, and ammonia at a flow rate of 325, into a processing chamber being operated at a temperature of 350° C., a pressure of 5 Torr, a RF power of 700 watts, with a heater spacing of about 360 mils between the heater and a substrate to deposit the material. The measured adhesion (kic) was about 0.28 $Mpa\text{-}m^{1/2}$.

Oxygen Doped Termination Layer

Oxygen doped termination layer to improve interlayer adhesion test results and examples are as follows. An oxygen doped silicon carbide termination layer was deposited by introducing trimethylsilane (TMS) at a flow rate of 160 sccm, helium at a flow rate of 400 sccm, oxygen at a flow rate of 400 sccm, into a processing chamber being operated at a temperature of 350° C., a pressure of 3 Torr, a RF power of 300 watts, with a heater spacing of about 300 mils between the heater and a substrate to deposit the material. The measured adhesion (kic) was about 0.27 $Mpa\text{-}m^{1/2}$.

Modified Dielectric Initiation Layer and Termination Layers

Comparisons of dielectric initiation layer test samples to improve interlayer adhesion with regard to temperature, precursor flow and spacing are shown as follows. Two samples at temperatures of 350° C. and 400° C. were deposited by introducing trimethylsilane (TMS) at a flow rate of 1400 sccm, helium at a flow rate of 400 sccm and oxygen at a flow rate of 400 sccm, into a processing chamber being operated at a pressure of 5 Torr, a RF power of 700 watts, with a heater spacing of about 360 mils between the heater and a substrate to deposit the material. The measured adhesion (kic) was about 0.22 $Mpa\text{-}m^{1/2}$ at 350° C. and about 0.27 $Mpa\text{-}m^{1/2}$ at 400° C. indicating improved adhesion at increased deposition temperatures.

Three samples of TMS flow rates at 1400 sccm, 700 sccm, and 160 sccm, were deposited by introducing helium at a flow rate of 400 sccm and oxygen at a flow rate of 400 sccm, into a processing chamber being operated at a temperature of 350° C., a pressure of 5 Torr, a RF power of 700 watts, with a heater spacing of about 360 mils between the heater and a substrate to deposit the material. The measured adhesion (kic) was about 0.22 $Mpa\text{-}m^{1/2}$ at 1400 sccm, about 0.24 $Mpa\text{-}m^{1/2}$ at 700 sccm, and about 0.28 $Mpa\text{-}m^{1/2}$ at 160 sccm, indicating improved adhesion at reduced precursor flow rates.

Three samples of heater spacings of 300 mils, 360 mils, and 460 mils, were deposited by introducing trimethylsilane (TMS) at a flow rate of 1400 sccm, helium at a flow rate of 400 sccm, and oxygen at a flow rate of 400 sccm, into a processing chamber being operated at a temperature of 350° C., a pressure of 5 Torr, a RF power of 700 watts to deposit the material. The measured adhesion (kic) was about 0.22 $Mpa\text{-}m^{1/2}$ at 360 mils, about 0.22 $Mpa\text{-}m^{1/2}$ at 460 mils, and about 0.30 $Mpa\text{-}m^{1/2}$ at 300 mils, indicating improved adhesion by narrower spacing between the heater and substrate surface.

While the foregoing is directed to preferred embodiments of the present invention, other and further embodiments of the invention may be devised without departing from the basic scope thereof, and the scope thereof is determined by the claims which follow.

What is claimed is:

1. A method for processing a substrate, comprising;
   depositing a barrier layer on the substrate, wherein the barrier layer comprises silicon and carbon and has a dielectric constant less than 4;
   depositing a dielectric initiation layer adjacent the barrier layer, wherein the dielectric initiation layer comprises silicon, oxygen, and carbon, and is deposited at a first temperature; and
   depositing a first dielectric layer adjacent the dielectric initiation layer, wherein the dielectric layer comprises silicon, oxygen, and carbon and has a dielectric constant of about 3 or less, and wherein the first dielectric layer is deposited at a second temperature less than the first temperature.

2. A method for processing a substrate, comprising:
   depositing a barrier layer on the substrate, wherein the barrier layer comprises silicon and carbon and has a dielectric constant less than 4;
   depositing a dielectric initiation layer adjacent the barrier layer; and
   depositing a first dielectric layer adjacent the dielectric initiation layer, wherein the dielectric layer comprises silicon, oxygen, and carbon and has a dielectric constant of about 3 or less, and wherein the dielectric initiation layer comprises silicon, oxygen, and carbon, and is deposited at a first deposition rate, and wherein the first dielectric layer is deposited at a second deposition rate less than the first deposition rate.

* * * * *

UNITED STATES PATENT AND TRADEMARK OFFICE
CERTIFICATE OF CORRECTION

PATENT NO.        : 6,913,992 B2                                          Page 1 of 1
APPLICATION NO. : 10/383837
DATED             : July 5, 2005
INVENTOR(S)       : Francimar Campana Schmitt et al.

It is certified that error appears in the above-identified patent and that said Letters Patent is hereby corrected as shown below:

In the Specification

Column 1, Line 64: Remove the comma after "diffusion of"

Column 3, Line 17: Change "Invention" to --invention--

Column 8, Line 6: Change "density" to --densify--

Column 8, Line 34: Change "trimethylsiiane" to --trimethysilane--

Column 8, Line 34-35: Change "1.3,5,7-tetramethylcyclotetrasiloxane" to --1,3,5,7-tetramethylcyclotetrasiloxane--

Column 8, Line 43: Change "scom" to --sccm--

Signed and Sealed this

First Day of August, 2006

JON W. DUDAS
*Director of the United States Patent and Trademark Office*